United States Patent
Zundel et al.

(10) Patent No.: US 7,598,143 B2
(45) Date of Patent: Oct. 6, 2009

(54) METHOD FOR PRODUCING AN INTEGRATED CIRCUIT WITH A TRENCH TRANSISTOR STRUCTURE

(75) Inventors: Markus Zundel, Egmating (DE); Joachim Krumrey, Goedersdorf (AT)

(73) Assignee: Infineon Technologies Austria AG, Villach (AT)

(*) Notice: Subject to any disclaimer, the term of this patent is extended or adjusted under 35 U.S.C. 154(b) by 99 days.

(21) Appl. No.: 11/861,900

(22) Filed: Sep. 26, 2007

(65) Prior Publication Data

US 2008/0076222 A1 Mar. 27, 2008

(51) Int. Cl.
H01L 21/336 (2006.01)
H01L 21/38 (2006.01)

(52) U.S. Cl. .................. 438/270; 257/341; 257/330; 438/546; 438/549

(58) Field of Classification Search .......... 438/270, 438/542, 543, 545–549, 197, 133, 243; 257/E29.257, 257/E21.418, E21.419, E21.428, E21.429, 257/330–342

See application file for complete search history.

(56) References Cited

U.S. PATENT DOCUMENTS 7,413,969 B2 * 8/2008 Kim et al. .................. 438/589

2005/0079676 A1 * 4/2005 Mo et al. .................... 438/268
2006/0124997 A1 * 6/2006 Yamauchi et al. ........... 257/330

FOREIGN PATENT DOCUMENTS

DE 10355588 A1 6/2005
WO 03034500 A2 4/2003

* cited by examiner

*Primary Examiner*—Ha Tran T Nguyen
*Assistant Examiner*—Aaron A Dehne
(74) *Attorney, Agent, or Firm*—Dicke, Billig & Czaja, PLLC

(57) ABSTRACT

A method for producing an integrated circuit including a semiconductor and in one embodiment a trench transistor structure, is disclosed. A first diffusion method is carried out. A second diffusion method is carried out, by which dopant atoms of a second conduction type are introduced via a first side into a mesa region and into a component region, which form a source zone in the mesa region, the diffusion methods being coordinated with one another in such a way that the dopant atoms of a second conduction type indiffuse further than the dopant atoms of a first conduction type from the first diffusion method, in the vertical direction in the component region and indiffuse not as far as the dopant atoms of the first conduction type in the vertical direction in the mesa region.

24 Claims, 3 Drawing Sheets

METHOD FOR PRODUCING AN INTEGRATED CIRCUIT WITH A TRENCH TRANSISTOR STRUCTURE

CROSS-REFERENCE TO RELATED APPLICATIONS

This Utility Patent Application claims priority to German Patent Application No. DE 10 2006 045 441.3 filed on Sep. 26, 2007, which is incorporated herein by reference.

BACKGROUND

The invention relates to a method for producing an integrated circuit with a trench transistor structure.

Trench transistors are usually power transistors having a multiplicity of transistor structures of identical type, transistor cells, each having a gate electrode arranged in a trench. Source and body regions of individual transistor cells are arranged in semiconductor regions, mesa regions, between two adjacent trenches of such a component structure.

The body zone and the source zone—which is doped complementarily with respect to the body zone—of such trench transistors can be produced by implantation of dopant atoms into the mesa regions and by subsequent indiffusion of the implanted dopant atoms. In this case, proceeding from a surface of the semiconductor body, the dopant atoms of the body zone are indiffused further than those of the source zone, such that a pn junction between the source zone and the body zone is formed.

In component arrangements having a trench transistor it may be necessary for various reasons to produce a semiconductor zone of the same conduction type as the source zone of the transistor in the semiconductor body outside the cell array with the transistor cells. Such a semiconductor zone is a "channel stopper", for example, which can be provided in the edge region of the semiconductor body and which serves in a known manner for interrupting a charge carrier channel in the edge region of the semiconductor body or for terminating the channel.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment provides a method for producing an integrated circuit including a source zone and a body zone of a trench transistor and a component zone having a net doping of the same conduction type as the source zone. The method includes providing a semiconductor body having a first and a second side and having a cell region, in which are arranged at least two trenches which extend into the semiconductor body proceeding from the first side in a vertical direction, and which are arranged in a manner spaced apart from one another in a first lateral direction of the semiconductor body and between which a mesa region is arranged.

In one embodiment, the method includes carrying out a first diffusion method, by which dopant atoms of a first conduction type are introduced via the first side into the mesa region and into a component region lying outside the cell region, with the dopant atoms forming the body zone in the mesa region, and also carrying out a second diffusion method, by which dopant atoms of a second conduction type are introduced via the first side into the mesa region and into the component region, with the dopant atoms forming the source zone in the mesa region. The two diffusion methods are coordinated with one another in such a way that the dopant atoms of the second conduction type indiffuse further than the dopant atoms of the first conduction type in the vertical direction in the component region and indiffuse not as far as the dopant atoms of the first conduction type in the vertical direction in the mesa region.

Figure 1A:
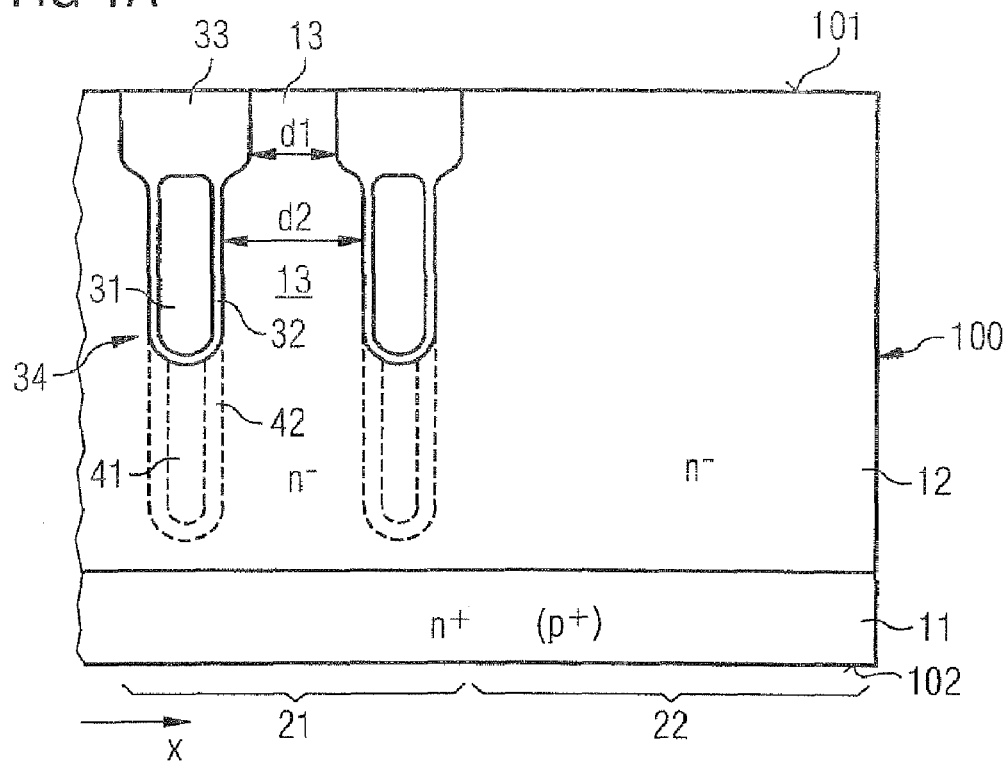
FIG. 1 illustrates in cross section an integrated circuit including a semiconductor body during different method processes.

FIG. 1A illustrates a cross section of an integrated circuit including a section of a semiconductor body 100 having component structures for realizing a trench transistor. The component structures comprise, in a first region 21 of the semiconductor body 100, which is referred to hereinafter as cell array region 21, at least two trenches 34 which extend into the semiconductor body 100 in a vertical direction proceeding from a first side 101 of the semiconductor body, which is referred to hereinafter as front side. These two trenches 34 are arranged in a manner spaced apart from one another in a first lateral direction x. In a direction running perpendicular to the plane of the drawing illustrated, the trenches 34 are formed for example in elongated fashion, that is to say that the dimensions of the trenches in the direction perpendicular to the plane of the drawing are a multiple of the dimensions of the trenches 34 in the first lateral direction x.

The reference symbol 13 in FIG. 1A designates a mesa region, that is to say a semiconductor region which lies between the trenches and is delimited by the trenches 34 in the first lateral direction x. It should be pointed out that only two trenches with an intervening mesa region 13 are represented in FIG. 1A for illustration purposes, but that a cell array of a power transistor usually has a multiplicity of trenches arranged in a manner spaced apart from one another with an intervening mesa region.

Gate electrodes 31 are arranged in the trenches 34, which gate electrodes are dielectrically insulated from the semiconductor body 100 by a gate dielectric 32 and, in the example illustrated, are arranged in a manner spaced apart from the front side 101 of the semiconductor body. The gate electrodes 31 can be contact-connected via a gate terminal in a manner not specifically illustrated. For contact-connection, the gate electrodes 31 can reach as far as the front side 101 of the semiconductor body in sections not illustrated in the sectional plane illustrated in FIG. 1A.

The trenches 34 arranged adjacent and in a manner spaced apart from one another in the first lateral direction x are realized in such a way that a width of the mesa region 13 in the first lateral direction x decreases in the direction of the front side 101, that is to say that the mesa region 13 tapers in the direction of the front side 101. In the case of the component structure illustrated in FIG. 1A, this is achieved by virtue of the fact that the trenches 34 widen in the direction of the front side 101. In the example illustrated, the mesa region 13 tapers or the trenches 34 widen in the direction of the front side 101 in stepped fashion. In this case, each of the trenches has a stepping in the direction of a mesa region, the mesa region in the example illustrated having a first width d1 above the stepping and a second width d2, which is larger than the first width d1, below the stepping.

In the case of the component structure illustrated, the gate electrodes 31 are arranged in a manner spaced apart from the front side 101 in the vertical direction of the semiconductor body 100 and are covered by an insulation layer in the direction of the front side 101. In this case, the process of the mesa region or of the trenches 34 is situated in the vertical direction approximately at the level of an upper edge of the gate electrodes 31, i.e. an edge lying in the direction of the front side 101.

Particularly in a section lying adjacent to the gate electrodes 31 in the first lateral direction x, the mesa region 13 in the example has a constant width, d2 in the example illustrated. Above the stepping, too, the mesa region can have a constant width, d1 in the example, but the mesa region can also taper even further in the direction of the front side above the stepping. The ratio between a largest width, d2 in the example, and a smallest width, d1 in the example, of the mesa region is for example between 1.2 and 10, that is to say that the following holds true:

$d1/d2 = 1.2 \ldots 10$

The ratio preferably lies between 1.5 and 5 and is preferably less than 2. The absolute width of the mesa region is between 300 nm and 400 nm, for example.

The trenches that widen in the direction of the front side 101 can be produced for example by using two successive etching processes. In this case, in a first etching process, trenches having a width corresponding to the width of the later trenches 34 in the lower region are etched using a first etching mask. In a second etching process, the trenches are "expanded" in the upper region, i.e. the region lying near the front side 101, using a second etching mask. In this case, the gate electrode 31 can be produced before the second etching process is carried out.

The semiconductor body illustrated in FIG. 1A has, in addition to the cell array region 21 with the trench structure, a further component region 22 arranged adjacent to the cell array region 21 in the first lateral direction x in the example illustrated. The component region can form in one embodiment an edge region of the semiconductor body 100, that is to say a region in which the semiconductor body ends in the lateral direction x.

The semiconductor body 100 illustrated includes a first semiconductor layer 11, for example a semiconductor substrate, which forms a drain zone of the later trench transistor in the region of the cell array 21, and also a further semiconductor layer 12 arranged on the first semiconductor layer 11, for example an epitaxial layer which is doped more weakly than the first semiconductor layer 11 and which forms a later drift zone of the component in the region of the cell array 21. In the case of a trench transistor realized as a MOSFET, the semiconductor substrate 11 is of the same conduction type as the drift zone 12 and is n-doped in the case of an n-channel MOSFET. In the case of a trench transistor formed as an IGBT, the first and second semiconductor layers 11, 12 are doped complementarily with respect to one another, which is illustrated by the doping type indicated between parentheses in FIG. 1A.

In the example illustrated, the second semiconductor layer 12, which forms the drift zone of the trench transistor in the cell array region 21, has an n-type doping. The doping concentration is in the region of $10^{16}$ cm$^{-3}$, for example. A method for producing a p-doped body zone, an n-doped source zone in the cell array region and also a channel stop zone (channel stopper) as further component zone in the edge region, which has an n-type net doping that is higher than a basic doping of the second semiconductor layer 12, is explained below with reference to FIGS. 1B to 1D.

Figure 1B:
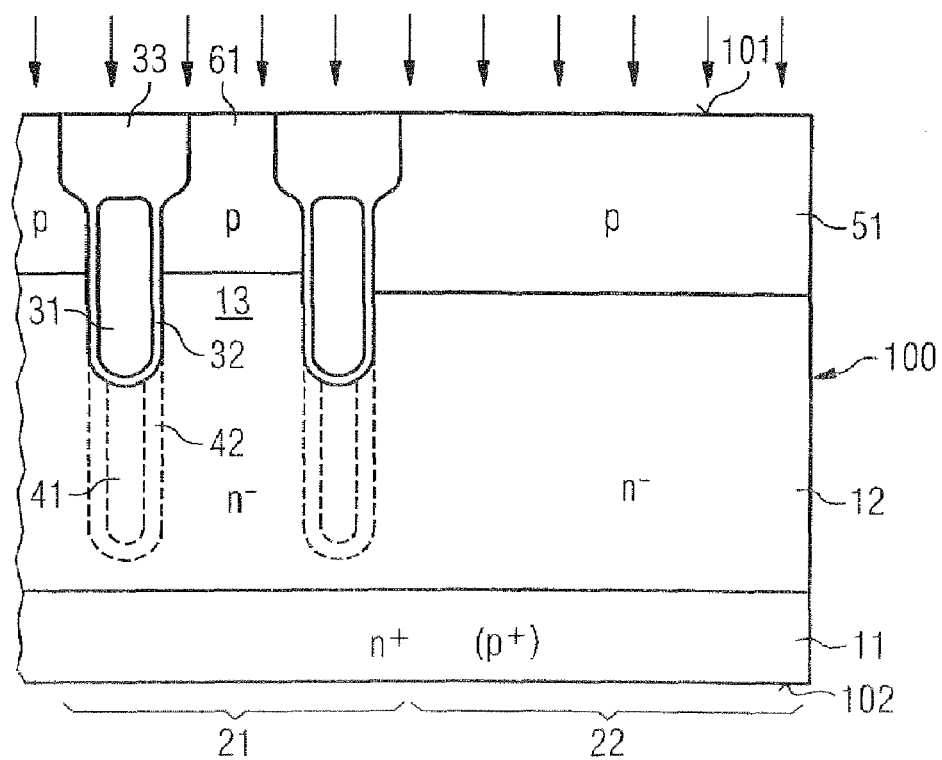

Referring to FIG. 1B, firstly p-type dopant atoms are indiffused into the semiconductor body 100 both into the mesa region 13 and into the further component region or edge region 22 by using a first diffusion method in a vertical direction proceeding from the front side 101. This diffusion method firstly includes an implantation process, by using which p-type dopant atoms are implanted via the first side 101 into the mesa region 13 and into the edge region 22 into regions of the semiconductor body 100 that are near the surface, and afterward a thermal process, by using which the semiconductor body 100 is heated to a predetermined diffusion temperature near the surface, that is to say at least down to the depth of the trenches 34, for a predetermined diffusion duration. The diffusion temperature is in the region of about 1000° C. The diffusion duration can be up to a few hours and is essentially dependent on the desired diffusion depth, that is to say the depth proceeding from the first side 101 into which p-type dopant atoms are intended to indiffuse in the vertical direction. In this case, the depth to which the p-type dopants maximally indiffuse determines that position within the semiconductor body 100 at which the pn junction arises between the later drift zone and the later body zone (61 in FIG. 1C). The reference symbol 61' in FIG. 1B designates a p-doped semiconductor zone produced by the diffusion method within the mesa region 13, which zone later forms the body zone of the trench transistor. In this case, the diffusion duration and the diffusion temperature are chosen, in one embodiment, such that that the p-type dopants indiffuse right into a region which, proceeding from the front side 101, lies below the upper edge of the gate electrode 31.

The reference symbol 51 in FIG. 1B designates a p-doped semiconductor zone in the edge region 22, which zone is produced by the implantation and subsequent diffusion of the p-type dopant atoms. In order to produce these p-doped zones 61, 51 in the mesa region 13 and edge region 22, for example boron ions are implanted. The implantation dose is in the region of $10^{14}$ cm$^{-2}$, for example.

Figure 1C:
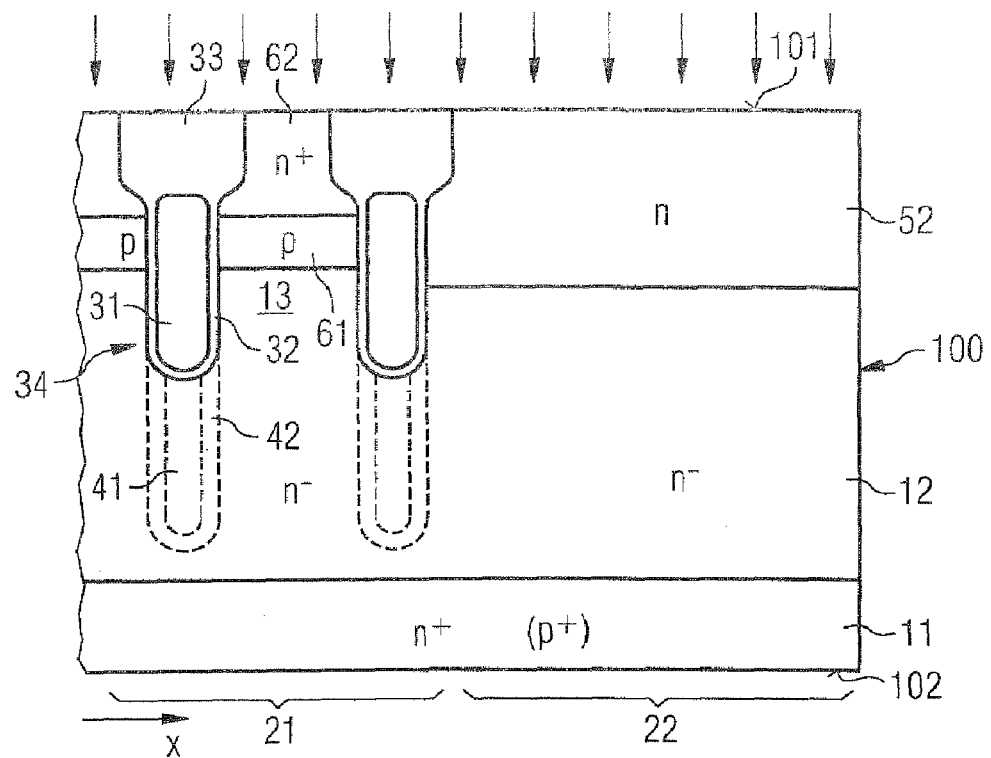

Referring to FIG. 1C, after indiffusion of the p-type dopant atoms, n-type dopant atoms are introduced into the mesa region 13 and the edge region 22 via the front side 101. For this purpose, the n-type dopant atoms are firstly implanted via the front side 101 into regions of the semiconductor body 100 that are near the surface, and are subsequently indiffused by heating the semiconductor body to a suitable diffusion temperature for a suitable diffusion duration in the vertical direction of the semiconductor body 100. In this case, the implantation dose of the n-type dopant atoms, for example phosphorus, is significantly higher than the implantation dose of the p-type dopant atoms in order that a "redoping" of the previously p-doped semiconductor zones is effected. The implantation dose is in the region of $10^{16}$ cm$^{-2}$ for example.

In this embodiment, the diffusion duration and the diffusion temperature of the second diffusion method for indiffusion of the n-type dopant atoms are chosen such that the n-type dopant atoms indiffuse into the semiconductor body 100 during the second diffusion method in the vertical direction just as far as or further than the p-type dopant atoms during the first diffusion method, with the result that a semiconductor region 52 having an n-type net doping arises in the edge region 22. The diffusion parameters, that is to say the diffusion temperature and the diffusion duration, are furthermore chosen such that the n-type dopant atoms, in the mesa region 13, indiffuse into the semiconductor body in the vertical direction 100 not as far as the p-type dopant atoms during the first diffusion method, with the result that a section 61 of the previously p-doped semiconductor region (61' in FIG. 1B) remains after the conclusion of the second diffusion method, which section forms the later body zone 61 of the component.

The different diffusion depths of the n-type dopant atoms in the edge region 22 and in the cell array region 21 are essentially caused by the mesa region 13 that widens proceeding from the front side 101. The widening of the mesa region has the effect that an area of the mesa region 13 available for dopant implantation at the top side 101 faces a larger semiconductor volume, over which the implanted dopant atoms are distributed during the subsequent diffusion method, than an identical area of the semiconductor body available for implantation in the edge region 22. During the diffusion method this has the effect that the n-type dopant atoms diffuse more slowly in the vertical direction of the semiconductor body 100 in the mesa region 13 than in the edge region 22, such that at a point in time during the diffusion method at which the n-type dopant atoms have already indiffused as far as the maximum depth of the p-type dopants in the edge region 22, the n-type dopants in the mesa region have not yet indiffused to the maximum diffusion depth of the p-type dopants. Consequently, in the mesa region 13 a pn junction arises between a p-doped region 61 produced by the p-type dopant atoms of the first diffusion method, which region 61 forms the body zone of the component, and an n-doped region 62 formed by the n-type dopant atoms of the second diffusion method, which region 62 forms the later source zone of the component. By contrast, a region 52 having an n-type dopant remains in the edge region 22, which region 52 is directly adjacent to a doped semiconductor region having the basic doping of the second semiconductor layer 12 and fulfills the function of a channel stop zone in the edge region 22 of the component.

One reason for the fact that the dopant atoms of the second conduction type indiffuse further into the semiconductor body in the component region 22 of the illustrated structure, given identical diffusion methods, than the dopant atoms of the first conduction type and in the mesa region 13 indiffuse not as far as the dopant atoms of the first conduction type is, therefore, the tapering of the mesa region between the trenches 34 in the direction of the front side 101 or the expansion of the mesa region 13 proceeding from the first side. The consequence of this expansion of the mesa region 13 is that the dopant atoms of the second conduction type diffuse in the mesa region 13 not only in the vertical direction but at least in part also in the first lateral direction of the semiconductor body. The diffusion rate of the dopant atoms of the second conduction type in the vertical direction of the semiconductor body is therefore lower within the mesa region than the diffusion rate of the dopant atoms of the second conduction type in the component region outside the cell array region. Given identical diffusion temperature and diffusion duration, the second dopant atoms thus diffuse further into the semiconductor body 100 in the component region than within the mesa region, such that in the mesa region a pn junction arises between a semiconductor region forming the body zone 52, which semiconductor region contains only dopant atoms of the first conduction type, and a second semiconductor region 62 forming the source zone. In this case, the source zone 62 contains dopant atoms of the first conduction type and dopant atoms of the second conduction type, the doping concentration of the dopant atoms of the second conduction type being higher than that of the first conduction type, such that a semiconductor region having a net doping of the second conduction type arises.

In the edge region, the dopant atoms of the second conduction type bring about a complete "redoping" of the doped semiconductor regions previously produced by the indiffusion of the dopant atoms of the first conduction type.

Although the last trench of the cell array in the direction of the edge region 22 can have a stepping in accordance with the rest of the trenches of the cell array, the stepping has no effect or only a negligible effect on the diffusion behavior of the n-type dopant atoms in the edge region since the dimensions of the edge region 22 in the first lateral direction x are significantly larger than the dimensions of the mesa region 13, such that the implantation area in the edge region 22 is significantly larger than the implantation area of the mesa region 13 and in the edge region 22 there is no appreciable "widening" of the semiconductor region proceeding from the front side 101.

The effect—explained above for the production of the n-doped zones—of a slower diffusion in the mesa region 13 due to the particular geometry of the trenches 34, which is referred to hereinafter as "geometry effect", also applies to the production of the p-doped zones 51, 61. Therefore, after the conclusion of the first diffusion method, the p-doped zone 51 arranged outside the cell array extends deeper into the semiconductor body 100 in the vertical direction than the p-type zone 61 in the mesa region. On account of the lower p-type implantation doses during production of the p-type zones 51, 61, however, this effect is less pronounced than during the production of the n-type zones 52, 62. Due to the significantly higher n-type implantation doses during production of the n-type zones 52, 62, the n-type dopant atoms diffuse more rapidly than the p-type dopant atoms. Furthermore, the retardation of the diffusion in the mesa region due to the geometry of the trenches is more pronounced than during the p-type diffusion, whereby it is possible for the n-type dopant atoms, in the region outside the cell array, to indiffuse deeper into the semiconductor body 100 in the vertical direction than the p-type dopant atoms and, in the mesa region, to indiffuse into the semiconductor body 100 not as far in the vertical direction as the p-type dopant atoms.

Figure 1D:
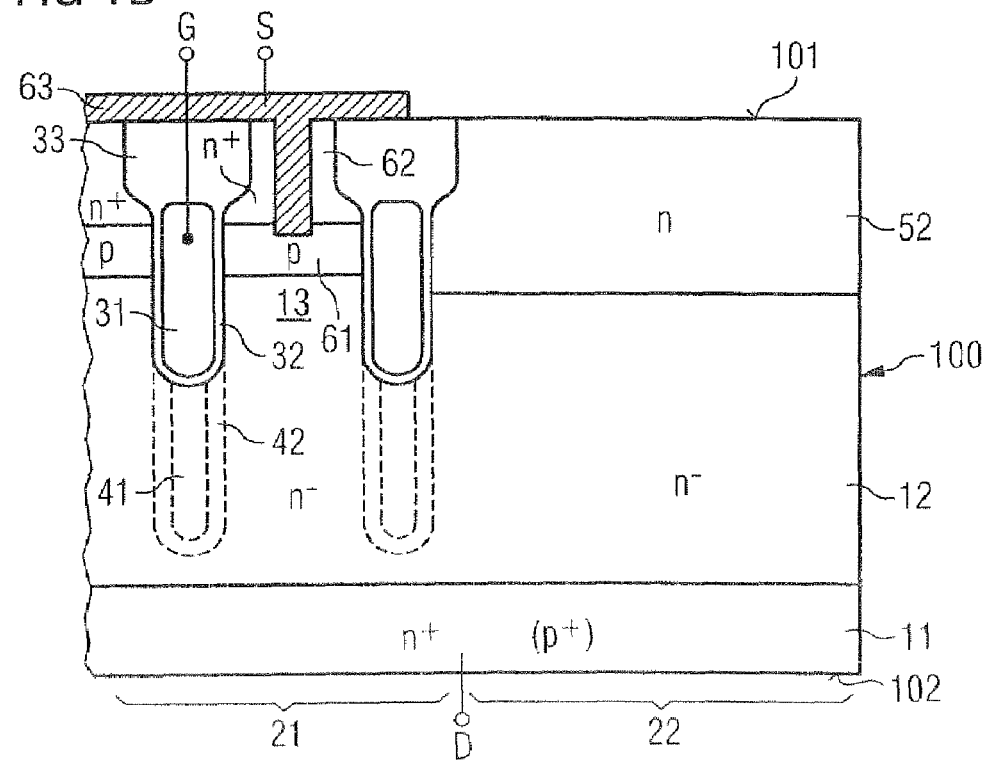

Referring to FIG. 1D, the component is completed by producing a source electrode 63, which is arranged above the front side 101 of the semiconductor body and which makes contact with the source zone 62. The source electrode 63 can extend in sections in a trench through the source zone 62 right into the body zone 61 in order to short-circuit the source zone and the body zone 62, 61 in a known manner.

As is illustrated by dashed lines in FIGS. 1A to 1D, the component can additionally have field electrodes 41 which are arranged for example below the gate electrodes 31 and which extend in the vertical direction of the semiconductor body 100 in sections along the drift zone in the cell array region 21. The field electrodes 41 are dielectrically insulated from the drift zone by a field dielectric layer 42, which is usually thicker than the gate dielectric layer 32, and are connected to the source electrode 63, for example, in a manner not specifically illustrated.

Besides the geometry of the trenches 34, a further effect can slow down the diffusion of the dopant atoms, in one embodiment of the n-type dopant atoms, in the mesa region 13 in comparison with the component region 22 outside the cell array 21: n-type dopant atoms, such as phosphorus (P), for example, diffuse particularly well via lattice vacancies in the crystal lattice of the semiconductor body 100, which is composed of silicon, for example. In a region near the interface between the mesa region 13 and the gate dielectric 32, which is usually composed of an oxide, this concentration of lattice vacancies is lower than in regions arranged further away from the interface, such that the diffusion of the n-type dopant atoms proceeds in a retarded fashion in the region of the semiconductor-oxide interface. This effect is referred to hereinafter as interface effect.

Figure 2:
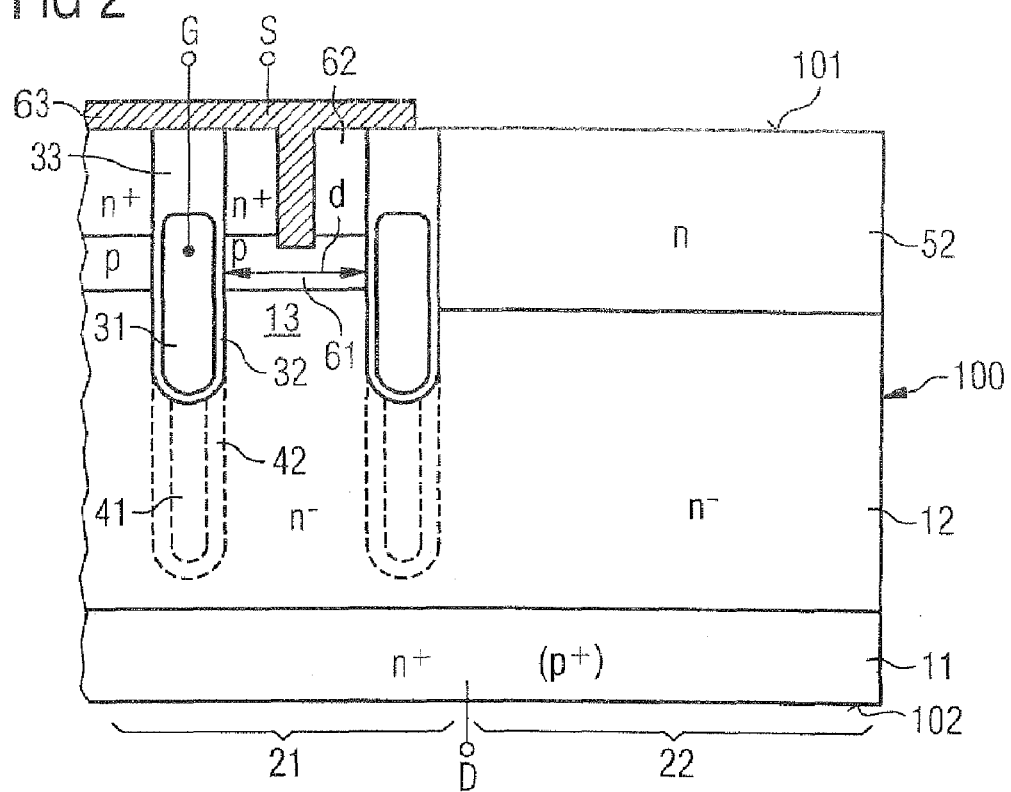
FIG. 2 illustrates in cross section a section of a component arrangement with a trench transistor and, in the example illustrated, a channel stop zone as further component zone.

If a width d of the mesa region 13 is sufficiently small, for example less than 800 nm and better less than 500 nm, then the interface effect acts on the entire mesa region 13, such that a diffusion of the n-type dopant atoms proceeds in a retarded fashion in the entire mesa region 13. FIG. 2 illustrates in cross section a MOSFET having an n-doped source zone 62 and a p-doped body zone 61 in the mesa region 13 and having an n-doped field stop zone 52 in the region 22 outside the cell array 21, which was produced only using the interface effect. In this case, the mesa region has at least approximately a constant width d, which is less than 800 nm, better less than 500 nm, and even better less than 400 nm. When using the interface effect, a different diffusion depth can be produced in the center of the mesa region 13 between two trenches and in a semiconductor region directly adjacent to the gate dielectric 32. In this case, this difference is all the more pronounced, the wider the mesa region.

In the course of an increase in the integration density, the dimensions of the trenches 34 and of the mesa region will decrease further in the lateral direction. Proceeding from present-day customary trench widths of 1 µm, the interface effect can be employed today already and also in the future whenever the width of the mesa region 13 is less than the trench width.

The above-explained geometry effect and the interface effect can be combined as desired in order to achieve different diffusion depths of the dopant atoms, in one embodiment the n-type dopant atoms. In this case, the diffusion durations during the production of the p-type and n-type semiconductor zones are substantially dependent on the depth to which the semiconductor zones are intended to reach into the semiconductor body 100 in absolute terms in the vertical direction, and are coordinated in such a way that the n-type dopant atoms "overtake" the p-type dopant atoms only in the region outside the cell array 21.

The above-explained methods for simultaneously producing source and body zones 62, 61 of a trench transistor and a component zone of the same conduction type as the source zone are not restricted to the production of a channel stop zone, but rather can be applied to the production of any desired semiconductor zones outside the cell array region which are of the same conduction type as the source zone of the trench transistor. It should also be noted in this connection that the first and second diffusion methods explained above can also be interchanged, that is to say that there is also the possibility of indiffusing firstly the n-type dopants forming the source zone and then the p-type dopants forming the body zone.

Figure 3:
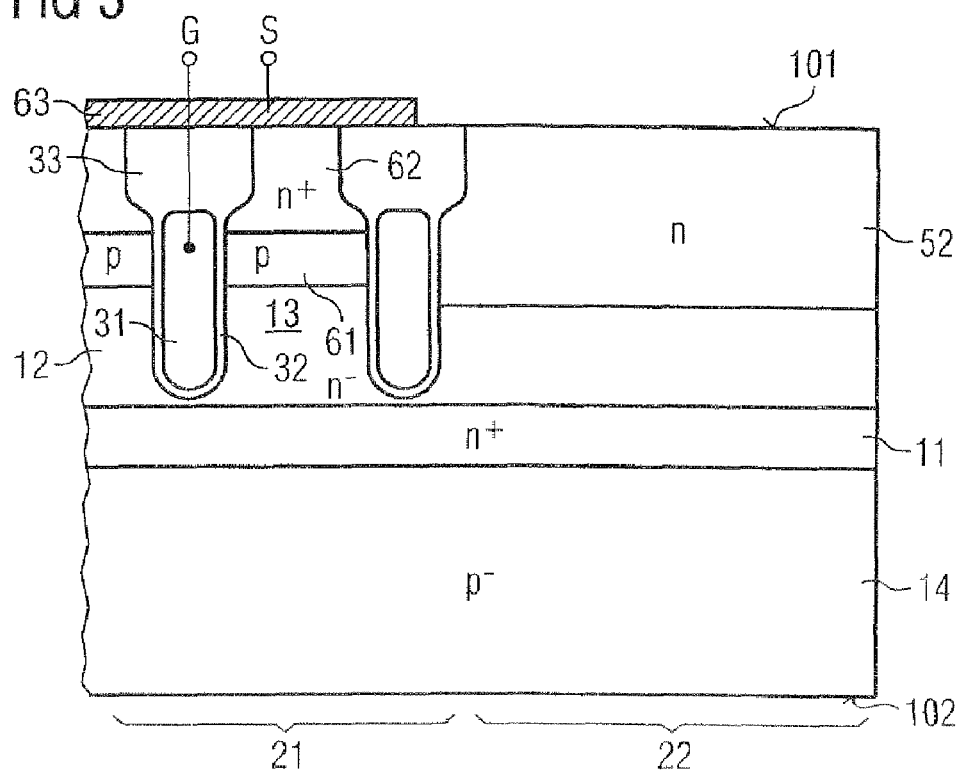
FIG. 3 illustrates a section of a semiconductor component, in which the further component zone is a drain terminal zone of a trench transistor having a buried drain zone.

FIG. 3 illustrates a cross section through a further semiconductor component produced using the geometry effect. In one embodiment, the component illustrated in FIG. 3, the drain zone 11 of the trench transistor is arranged as a buried semiconductor zone between the semiconductor layer 12 forming the drift zone and a semiconductor layer 14 doped complementarily with respect to the drift zone 12. In this case, the complementarily doped semiconductor layer 14 can be a semiconductor substrate which is weakly doped in comparison with the drain zone 11 and is doped complementarily with respect to the drain zone 11. In one embodiment, in contrast to the component in accordance with FIG. 1D, contact can be made with the drain zone 11 via the front side 101 of the semiconductor body 100. For this purpose, in the case of this component, there is present adjacent to the cell array region 21 with the trench structure a terminal zone 52 of the same conduction type as the source zone 62 and the drain zone 11, which serves for making contact with the drain zone 11. The terminal zone 52 is produced by the same method processes which have been explained with reference to FIGS. 1A to 1D and are used to produce, in the cell array region 21, the body zone 61 and the source zone 62 within the mesa region 13.

The region 22 of the semiconductor body in accordance with FIG. 3, in which region the terminal zone 52 is present, can be an edge region of the semiconductor body but can also be arranged in a manner spaced apart from the edge of the semiconductor body.

Such a component illustrated in FIG. 3 with a drain terminal 52 lying in the region of the front side can, of course, also be produced using the interface effect or a combination of interface effect and geometry effect.

It goes without saying that the methods explained above are not restricted to the production of a channel stop zone or a drain terminal zone but rather can be used for producing any desired component zones of the same conduction type as the source zone which lie outside the cell array of the trench transistor. The method is for example also suitable for producing component zones of sensors which are integrated in the semiconductor body outside the cell array.

Furthermore, the methods explained are not restricted to the production of an n-channel MOSFET having an n-type source zone 62 and an n-doped component zone 52 outside the cell array, but rather can also be applied to the production of a p-channel MOSFET having a p-type source zone and a p-doped component zone 52 outside the cell array, since the different diffusion rates of the dopant atoms forming the source zone, the body zone and the terminal zone are individually selectable and can be introduced into the respective design.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing an integrated circuit including a trench transistor structure comprising:
   providing a semiconductor body having a first and a second side and having a cell region;
   carrying out a first diffusion method, including introducing dopant atoms of a first conduction type via the first side into a mesa region and into a component region lying outside the cell region, which form a body zone in the mesa region; and
   carrying out a second diffusion method, by introducing dopant atoms of a second conduction type into the mesa region and into the component region, which form a source zone in the mesa region, the diffusion methods being coordinated such that the dopant atoms of the second conduction type indiffuse further than the dopant atoms of the first conduction type in a vertical direction in the component region and indiffuse not as far as the dopant atoms of the first conduction type in the vertical direction in the mesa region.

2. The method of claim 1, comprising:
   at least two trenches which extend into the semiconductor body proceeding from the first side in a vertical direction, spaced apart from one another in a first lateral direction of the semiconductor body and between which the mesa region is arranged.

3. The method as claimed in claim 1, in which a width of the mesa region in the first lateral direction decreases in the direction of the first side of the semiconductor body.

4. The method of claim 1, in which the first and second diffusion methods in each case comprise an implantation of dopant atoms via the first side into the semiconductor body and a subsequent thermal treatment by using which the implanted dopant atoms indiffuse further.

5. The method of claim 1, comprising wherein the implantation dose for dopant atoms of the first conduction type is between $10^{13}$ cm$^{-2}$ and $10^{15}$ cm$^{-2}$.

6. The method of claim 1, comprising wherein the implantation dose for dopant atoms of the first conduction type is between $10^{15}$ cm$^{-2}$ and $10^{17}$ cm$^{-2}$.

7. A method for producing an integrated circuit including a semiconductor having a source zone and a body zone of a trench transistor structure and a component zone having a net doping of the same conduction type as the source zone, comprising:
   providing a semiconductor body, including at least two trenches and between which a mesa region is arranged;
   carrying out a first diffusion method, by which dopant atoms of a first conduction type are introduced via a first side into the mesa region and into a component region lying outside the cell region; and
   carrying out a second diffusion method, by which dopant atoms of a second conduction type are introduced via the first side into the mesa region and into the component region, which form the source zone in the mesa region, the diffusion methods being coordinated with one another in such a way that the dopant atoms of the second conduction type indiffuse further than the dopant atoms of the first conduction type in the vertical direction in the component region.

8. The method of claim 7, comprising wherein the dopant atoms of the second conduction type indiffuse not as far as the dopant atoms of the first conduction type in the vertical direction in the mesa region.

9. The method as claimed in claim 7, in which a width of the mesa region in the first lateral direction decreases in the direction of the first side of the semiconductor body.

10. The method of claim 7, comprising wherein a width of the mesa region is less than 800 nm, and the mesa region adjoins a dielectric in the region of the trenches.

11. The method of claim 10, comprising wherein a width of the mesa region is less than 500 nm.

12. The method of claim 10, comprising wherein the dielectric is an oxide.

13. The method of claim 7, comprising wherein a ratio between a largest width and a smallest width of the mesa region in the first lateral direction is between 1.2 and 10.

14. The method of claim 13, comprising wherein the ratio between a largest width and a smallest width of the mesa region in the first lateral direction is between 1.5 and 5.

15. The method of claim 13, comprising wherein the ratio between a largest width and a smallest width of the mesa region in the first lateral direction is between 1.5 and 2.

16. The method of claim 13, in which the smallest width of the mesa region is between 100 nm and 400 nm.

17. The method of claim 7, in which the first and second diffusion methods in each case comprise an implantation of dopant atoms via the first side into the semiconductor body and a subsequent thermal treatment by using which the implanted dopant atoms indiffuse further.

18. The method of claim 7, comprising wherein the implantation dose for dopant atoms of the first conduction type is between $10^{13}$ cm$^{-2}$ and $10^{15}$ cm$^{-2}$.

19. The method of claim 7, comprising wherein the implantation dose for dopant atoms of the first conduction type is between $10^{15}$ cm$^{-2}$ and $10^{17}$ cm$^{-2}$.

20. The method of claim 7, comprising arranging in each case at least one gate electrode in the trenches.

21. The method of claim 20, comprising arranging at least one field electrode in the trenches.

22. The method of claim 7, comprising tapering the mesa region in the direction of the front side in stepped fashion with at least one process in the first lateral direction.

23. The method of claim 7, comprising:
   arranging the gate electrode in a manner spaced apart from the first side; and
   arranging a section of the mesa region in the first lateral direction between the gate electrodes having a constant width at least in sections.

24. A method for producing an integrated circuit including a source zone and a body zone of a trench transistor structure and a component zone having a net doping of the same conduction type as the source zone, comprising:
   providing a semiconductor body having a cell region, in which are arranged at least two trenches, and a mesa region;
   carrying out a first diffusion method, which forms the body zone in the mesa region; and
   carrying out a second diffusion method, which forms the source zone in the mesa region, the diffusion methods being coordinated with one another in such a way that dopant atoms of the second diffusion method indiffuse further than dopant atoms of the first diffusion method in a vertical direction in the component region, and indiffuse not as far as the dopant atoms of the first diffusion method in the vertical direction in the mesa region.

* * * * *